United States Patent [19]

Isozaki

[11] Patent Number: 5,198,813
[45] Date of Patent: Mar. 30, 1993

[54] DIGITAL RECORDING SYSTEM WITH (8,16,2,5) RUN LENGTH LIMITED (RLL) CODE

[75] Inventor: Masaaki Isozaki, Kanagawa, Japan

[73] Assignee: Sony Corporation, Tokyo, Japan

[21] Appl. No.: 811,972

[22] Filed: Dec. 23, 1991

[30] Foreign Application Priority Data

Dec. 27, 1990 [JP] Japan .................. 2-414666

[51] Int. Cl.⁵ .............................. H03M 7/00
[52] U.S. Cl. ........................ 341/59; 341/58; 360/40
[58] Field of Search ............ 341/58, 59, 68, 69, 341/70, 71, 72, 73, 106; 360/40; 375/19

[56] References Cited

U.S. PATENT DOCUMENTS

| | | | |
|---|---|---|---|
| 4,394,641 | 7/1983 | Ratigalas | 341/58 |
| 4,500,871 | 2/1985 | Aritigalas | 341/58 |
| 4,520,346 | 5/1985 | Shimada | 341/58 |
| 4,760,378 | 7/1988 | Iketani | 341/59 |
| 4,833,471 | 5/1989 | Tokuume et al. | 341/67 |
| 4,851,837 | 6/1989 | Baldwin | 360/40 X |
| 4,870,572 | 9/1989 | Hosono et al. | 395/425 |

FOREIGN PATENT DOCUMENTS 0144449 6/1985 European Pat. Off. .
62-49724 3/1987 Japan .................. 341/58
1-57825 3/1989 Japan .................. 341/59

Primary Examiner—Howard L. Williams
Attorney, Agent, or Firm—Alvin Sinderbrand; William S. Frommer

[57] ABSTRACT

A digital modulation system is disclosed in which a string of input data is divided at intervals of 8 bits and the resulting 8-bit data words are converted into 16-bit modulated digital code data words. Code conversion is made so that the resulting 16-bit modulation code words have two or more consective digits between the 2nd and the 15th bits, five or less consecutive digits between the 1st and the 16th bits, four or less consecutive digits between the 13th and the 16th bits, the absolute value of the CDS of all 16 bits in each modulation code block is not more than 4 and the absolute value of the DSV from the leading bit to an arbitrary bit in each modulation code block is not more than 5. Also, the number of consecutive digits in any portion of the digital data is not less than 2 and not more than 5 and the absolute value of the DSV is not more than 3 from the beginning of the coded data stream to any point therein. An error rate more favorable than the $M^2$ code of conventional digital modulation systems may be achieved in order to realize short wave length recording on narrower tracks for high density recording in a digital video recorder.

6 Claims, 4 Drawing Sheets

DIGITAL RECORDING SYSTEM WITH (8,16,2,5) RUN LENGTH LIMITED (RLL) CODE

BACKGROUND OF THE INVENTION

1. Field of the Invention

This invention relates to an encoding circuit for serial transmission of binary data through an information channel. More particularly, it relates to a digital modulation system which is effective in high density data recording or the like.

2. Related Art Statement

A so-called D-2 format, currently employed in a composite digital video tape recorder, makes use of an $M^2$ code (Modified Miller Code) as a code system for digital modulation. The $M^2$ modulation code is a non-block modulation system.

The $M^2$ code modulation system has a variety of excellent characteristic parameters, as discussed hereinbelow.

If the period of a train of modulated signals is expressed as T, the minimum length between transistions $T_{MIN}$, which is the minimum distance between a point of signal inversion or transition and the next point of transition, is given by $T_{MIN}=1.0$ T for the $M^2$ code.

The maximum length between transitions $T_{MAX}$, that is the maximum distance between a point of signal inversion or transition and the next point of transition, is given by $T_{MAX}=3.0$ T.

The window margin $T_W$, which is a measure of the tolerance of the amount of variation in the signal time axis that may be tolerated with respect to code error, is given by $T_W=0.5$ T.

The most significant feature of the $M^2$ modulation code system resides in that it is free of d.c. components, i.e. it is a d.c. free code system. A digital sum value (DSV), used in a known manner in evaluating the content of the d.c. components of modulated signals, gives a measure of the d.c. components by a value of the sum total of scores $+1$ and $-1$, with the score $+1$ and the score $-1$ being given to a high level "1" and a low level "0" of a code data waveform, respectively. With the $M^2$ modulation code, occurrences of level transitions are controlled so that the DSV value is within $\pm 3$, thus making the code d.c. free. The $M^2$ code modulation, being d.c. free, significantly aids system implementation.

The minimum length between transitions $T_{MIN}$ is as low as 1.0 T to provide for possibility of high recording density. Data recording or the like in accordance with this format enables high quality data transmission or the like.

Meanwhile, there is a possibility of a still higher recording density in data recording. That is, it may be expected that recording will be made in future using a shorter wavelength and a narrower track.

Considering that tracking accuracy may not meet a predetermined tolerance, if a narrower track width is used, data may be read using a reproducing magnetic head having a wider width than the track width. In such a case, the reproducing magnetic head reads out data recorded on adjacent tracks. That is, crosstalk occurs between adjacent tracks causing deterioration in S/N ratio.

Crosstalk between adjacent tracks becomes most acute with recording in a wavelength region for which an azimuth loss effect of the magnetic head is diminished, that is, with recording at a lower frequency.

OBJECT AND SUMMARY OF THE INVENTION

In view of the above described state of the art, it is an object of the present invention to provide a digital modulation system which is more d.c. free than the currently employed $M^2$ code modulation system and with which it is possible to realize an error rate favorable for high density recording.

In accordance with the present invention, there is provided a digital modulation system in which a string of input data is divided at intervals of eight bits and the resulting 8-bit data words are converted into 16-bit digital modulation code data words. The 16-bit digital modulation code data satisfy the conditions that the consecutive number of "0"s or "1"s is two or more between the 2nd bit and the 15th bit, the consecutive number of "0"s or "1"s between the 1st bit and the 16th bit is five or less, the consecutive number of "0"s or "1"s between the 13th bit and the 16th bit is four or less, the absolute value of the code word digital sum CDS of the 16 bits of the modulation code data word, used for calculating a digital sum value (DSV), is 4 or less, and that the absolute value of the code word digital sum from the leading bit to a k'th bit in the modulation code data word, or the CDS(k), k being arbitrary, is 5 or less. In addition, the number of consecutive "0"s or "1"s in any portion of digital data produced upon consecutively transmitting or recording 16-bit digital modulation code data satisfying the above conditions is not less than two and not more than five, the 16-bit digital modulation code data being substantially dc free and the absolute value of the DSV being not more than three.

With a digital modulation system according to the present invention, as compared to the $M^2$ modulation code system, such parameters as the minimum length between transitions $T_{MIN}$ and the window margin $T_W$, are maintained at the same values as those for the $M^2$ modulation code system, while the maximum length between transitions $T_{MAX}$ is less than that in the $M^2$ code modulation. As a result, the low frequency components may be diminished as compared with the $M^2$ code modulation.

With the digital modulation system of the present invention, because of the lower content of the low frequency components, crosstalk between adjacent tracks during recording may be diminished to improve an S/N ratio of an eye pattern.

Although the minimum recording wavelength, that is the minimum length between transitions, used for recording, is equal to that of the $M^2$ code, clocks may be locked with the PLL system at the reproducing side more easily because the maximum length between transitions $T_{MAX}$ is 2.5 T.

With the digital modulation system of the present invention, the erasure rate during overwriting may be improved due to higher spectral concentration.

In addition, it becomes possible with the present digital modulation system to diminish the peak shift of recording data produced during recording.

DESCRIPTION OF PREFERRED EMBODIMENTS

Figure 1:
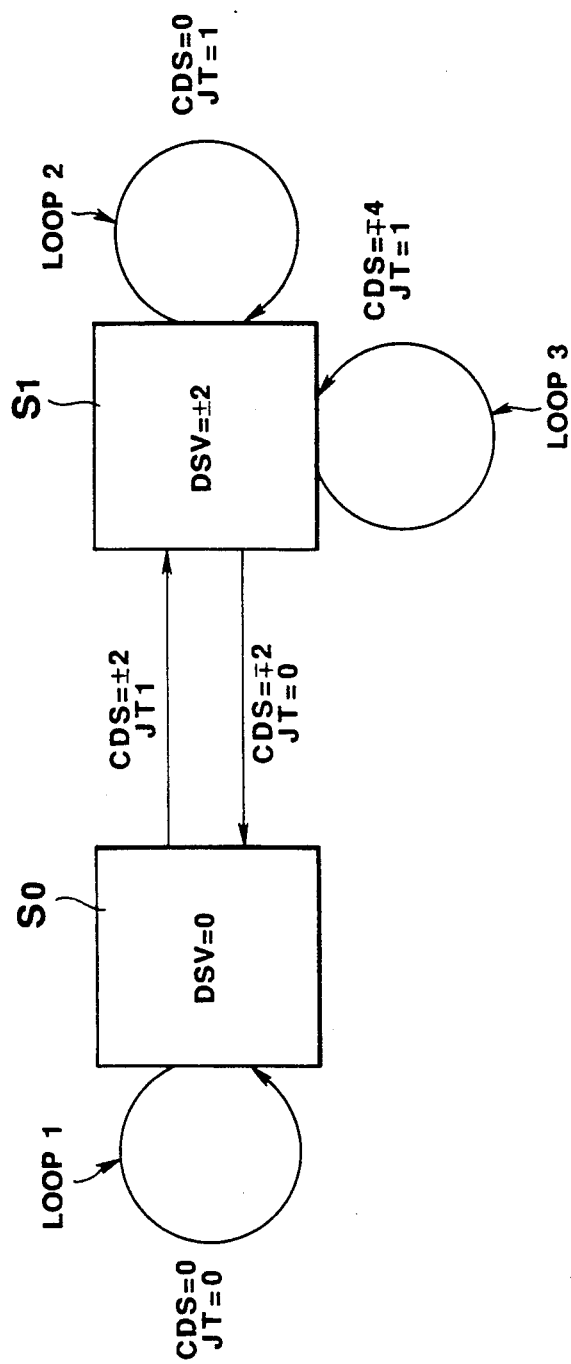
FIG. 1 is a state transition diagram showing state transitions for a digital modulation system according to the present invention.

Referring to the drawings, certain preferred embodiments of the present invention will be explained in more detail hereinbelow.

With the present digital modulation system, input data are divided at an interval of 8 bits, and the resulting 8-bit data words are converted into 16-bit modulated coded digital data words. Specifically, there are $2^8$ input 8-bit binary data words, that is, 256 input data words, whereas there are $2^{16}$ 16-bit binary signals, in other words, 256 8-bit input data maybe converted into up to 65,536 16-bit data words.

Thus a plurality of candidate conversion codes correspond to each input data word. Since it becomes necessary to select conversion codes from these candidate conversion codes quickly so that the selected conversion codes are dc-free and free from low frequency components to give low error rates, those conversion codes which will satisfy the following conditions are previously arranged as conversion tables (table columns). That is, with the 8-16 conversion code, the input data are modulated so that there are two or more consecutive "0"s or "1"s from the 2nd bit to the 15th bit of the above mentioned 16-bit conversion code data; there are 5 or less consecutive "0"s or "1"s between the first bit and the 16th bit of the 16-bit conversion code data; there are four or less consecutive "0"s or "1"s between the 13th bit and the 16th bit of the 16-bit conversion code data; the absolute value of the code word digital sum (CDS) of the 16 bits of the modulation code, produced when calculating a digital sum value (DSV) by summing "1"s and "0"s of the bits in the modulation code data as "+1" and "−1", respectively, is 4 or less; and the absolute value of the code word digital sum from the leading bit to an arbitrarily selected k'th bit in the modulation code data, or the CDS (k), is 5 or less.

The above is the rule of conversion when a single modulation code according to the 8–16 digital conversion system, or a modulation code block, is treated by itself. If a plurality of these modulation code blocks are arrayed in juxtaposition to each other, those modulation code data which are more desirable for the digital data stream in its entirety are selected from the plural candidate modulation codes corresponding to each of the 256 data, as mentioned hereinabove.

Specifically, with the present conversion code, not only do the above conditions need to be satisfied, but also coupling between adjacent code blocks needs to be taken into account, as will be explained subsequently. That is, in any portion of consecutively transmitted or recorded digital data, the number of consecutive "0"s or "1"s is 2 or more and 5 or less, there should be no d.c. components, and the absolute value of the DSV is 3 or less. Each 8-bit data word divided from the input data string is modulated by selecting the modulation data code associated with the input data. If, above all, coupling between adjacent modulation code blocks is done so as to satisfy the conditions which will be explained below, the sum of the waveform levels or DSV equals 0 or equals ±2. As will be explained below, several conversion tables are provided in the present embodiment, so that there may be quick selection of conversion codes corresponding to the input data words and satisfying the requirements of various cases.

Several specific examples are given below in connection with the modulation codes conforming to the above rule.

In the first place, the digital sum value DSV, represented by the sum of the digital waveform levels of the coded data or bits, wherein digital waveform levels "1" and "0" are given the values of "+1" and "−1", respectively, is used as an index for judging that the modulation code is free of d.c. components, that is, d.c. free.

Secondly, the code word digital sum CDS, indicating the sum of code waveform levels, indicates the sum of all of the digital waveform levels within each 16-bit modulation code data word.

Thirdly, CDS (k) means the sum of the digital code word waveform levels from the leading bit to an arbitrary bit k of each modulation code data word.

Similarly, the sum of the waveform levels of an nth 16-bit modulation code DSV(n), as found in accordance with the above rule, represents the sum of the digital waveform levels of the coded data or bits from the beginning of the data stream until the current time. In other words, the sum of the digital waveform levels DSV(n) of the 16-bit modulation code at the current time point represents the sum of the digital waveform levels of the 16-bit modulation code data up to the (n−1)th modulation code block and the digital waveform levels of the current 16-bit modulation code block.

The above mentioned three types of the level sum values are represented by the equations 1, 2 and 3.

$$CDS = \sum_{i=1}^{15} (2 \times A_i - 1) \quad \text{[Equation 1]}$$

$$CDS(k) = \sum_{i=1}^{k} (2 \times A_i - 1) \quad \text{[Equation 2]}$$

$$DSV(n) = DSV(n-1) + CDS \quad \text{[Equation 3]}$$

In the above equations, k assumes a value of $1 \leq k \leq 16$, and the variable n represents that the modulation code block is the nth 16-bit code block among the 16-bit modulation code blocks, whilst $A_i$ in the equations 1 and 2 indicates the value of the bits, which may be binary "1" or "0".

With the above mentioned modulation codes in which all of the conditions of the above mentioned rules for converting the 8-bit digital data into 16-bit digital conversion code data are satisfied, the value of the sum of the waveform levels or DSV of the modulated code data from the beginning of the data stream until the current time, is either equal to 0 or equal to ±2. In any part of the continuously transmitted or recorded digital data, taking account of coupling between adjacent code blocks, the number of the consecutive "0"s or "1"s is 2 or more to 5 or less, the d.c. components are eliminated and the absolute value of the DSV is 3 or less.

Using the above symbols and equations, explanation is given hereinbelow with reference to Tables 1 to 5.

TABLE 1

|  | DSV = 0 | DSV = +2 | DSV = −2 |
|---|---|---|---|
| 0(00H) | CDS = 0 00~11<br>−3 ≤ CDSP ≤ 1<br>CDS = ÷2 00~11<br>−3 ≤ CDSP ≤ 3<br>CDS = 0 00~11<br>−3 ≤ CDSP ≤ 3 | CDS = 0 11~00<br>1 ≤ CDSP ≤ 3<br>CDS = −2 11~00<br>−3 ≤ CDSP ≤ 3<br>CDS = 0 11~10<br>−3 ≤ CDSP ≤ 3 | CDS = 0 00~11<br>−3 ≤ CDSP ≤ 1<br>CDS = 0 00~11<br>$CDSP_{MIN}$ = −4,−5<br>CDS = −2 00~01<br>00~11<br>−5 ≤ CDSP ≤ 1 | CDS = 0 11~00<br>−1 ≤ CDSP ≤ 3<br>CDS = 0 11~00<br>$CDSP_{MAX}$ = 4,5<br>CDS = ÷2 11~10<br>11~00<br>−1 ≤ CDSP ≤ 5 |
|  | CDS = 0 00~11<br>$CDSP_{MAX}$ = 2,3<br>CDS = 0 01~01<br>01~11<br>−3 ≤ CDSP ≤ 3<br>CDS = ÷2 01~11<br>$CDSP_{MIN}$ = −2,−3<br>CDS = ÷2 01~11<br>−1 ≤ CDSP ≤ 3<br>CDS = −2 00~00<br>−3 ≤ CDSP ≤ 1 | CDS = 0 11~00<br>$CDSP_{MIN}$ = −2,−3<br>CDS = 0 10~10<br>10~00<br>−3 ≤ CDSP ≤ 3<br>CDS = −2 10~00<br>$CDSP_{MAX}$ = 2,3<br>CDS = −2 10~00<br>−3 ≤ CDSP ≤ 1<br>CDS = ÷2 11~11<br>−1 ≤ CDSP ≤ 3 | CDS = −4 10~00<br>−5 ≤ CDSP ≤ 1<br>CDS = −2 10~10<br>−5 ≤ CDSP ≤ 1<br>CDS = −2 10~00<br>$CDSP_{MIN}$ = −4,−5<br>CDS = −2 10~00<br>−3 ≤ CDSP ≤ 1<br>CDS = −2 00~00<br>−3 ≤ CDSP ≤ 1 | CDS = ÷4 01~11<br>−1 ≤ CDSP ≤ 5<br>CDS = ÷2 01~01<br>−1 ≤ CDSP ≤ 5<br>CDS = ÷2 01~11<br>$CDSP_{MAX}$ = 4,5<br>CDS = ÷2 01~11<br>−1 ≤ CDSP ≤ 3<br>CDS = ÷2 11~11<br>−1 ≤ CDSP ≤ 3 |
| 127(7FH)<br>128(80H) | CDS = 0 00~00<br>00~10<br>−3 ≤ CDSP ≤ 3<br>CDS = −2 00~00<br>$CDSP_{MAX}$ = 2,3<br>CDS = −2 01~00<br>−3 ≤ CDSP ≤ 3<br>CDS = 0 01~10<br>−3 ≤ CDSP ≤ 3<br>CDS = 0 01~00<br>$CDSP_{MIN}$ = −2,−3<br>CDS = 0 01~00 | CDS = 0 11~11<br>11~01<br>−3 ≤ CDSP ≤ 3<br>CDS = ÷2 11~11<br>$CDSP_{MIN}$ = −2,−3<br>CDS = ÷2 10~11<br>−3 ≤ CDSP ≤ 3<br>CDS = 0 10~01<br>−3 ≤ CDSP ≤ 3<br>CDS = 0 10~11<br>$CDSP_{MAX}$ = 2,3<br>CDS = 0 10~11 | CDS = −2 00~00<br>$CDSP_{MIN}$ = −4,−5<br>CDS = −4 00~00<br>−5 ≤ CDSP ≤ 1<br>CDS = −2 00~10<br>−5 ≤ CDSP ≤ 1<br>CDS = −2 10~11<br>−5 ≤ CDSP ≤ 1<br>CDS = −2 10~01<br>−5 ≤ CDSP ≤ 1<br>CDS = 0 10~11 | CDS = ÷2 11~11<br>$CDSP_{MAX}$ = 4,5<br>CDS = ÷4 11~11<br>−1 ≤ CDSP ≤ 5<br>CDS = ÷2 11~01<br>−1 ≤ CDSP ≤ 5<br>CDS = ÷2 01~00<br>−1 ≤ CDSP ≤ 5<br>CDS = ÷2 01~10<br>−1 ≤ CDSP ≤ 5<br>CDS = 0 01~00 |
| 255(FFH) | −1 ≤ CDSP ≤ 3 | −3 ≤ CDSP ≤ 1 | −3 ≤ CDSP ≤ 1 | −1 ≤ CDSP ≤ 3 |

TABLE 2

| Table Column 0 |  | CDS | JT |
|---|---|---|---|
| . | . |  |  |
| . | . |  |  |
| . | . |  |  |
| 120 | 0111000111100011 | 2 | 1 |
| 121 | 0111001100110011 | 2 | 1 |
| 122 | 0111001110000111 | 2 | 1 |
| 123 | 0111100001100111 | 2 | 1 |
| 124 | 0111100001110011 | 2 | 1 |
| 125 | 0111100011000111 | 2 | 1 |
| 126 | 0111100011100011 | 2 | 1 |
| 127 | 0111100110000111 | 2 | 1 |
| 128 | 0001100110011100 | −2 | 1 |
| 129 | 0001100111001100 | −2 | 1 |
| 130 | 0001110001111000 | −2 | 1 |
| 131 | 0001110011001100 | −2 | 1 |
| 132 | 0001111000011100 | −2 | 1 |
| 133 | 0001111000111000 | −2 | 1 |
| 134 | 0011000110011100 | −2 | 1 |
| 135 | 0011000111001100 | −2 | 1 |
| 136 | 0011001100011100 | −2 | 1 |
| 137 | 0011001100111000 | −2 | 1 |
| 138 | 0011001110001100 | −2 | 1 |
| 139 | 0011001110011000 | −2 | 1 |
| 140 | 0011100001111000 | −2 | 1 |
| 141 | 0011100011001100 | −2 | 1 |
| 142 | 0011100110001100 | −2 | 1 |
| 143 | 0011100110011000 | −2 | 1 |
| 144 | 0001100110011110 | 0 | 0 |
| 145 | 0001100111001110 | 0 | 0 |
| 146 | 0001100111100110 | 0 | 0 |
| 147 | 0001110001111100 | 0 | 0 |
| 148 | 0001110011001110 | 0 | 0 |
| 149 | 0001110011100110 | 0 | 0 |
| 150 | 0001110011111000 | 0 | 0 |
| . | . |  |  |
| . | . |  |  |
| . | . |  |  |

TABLE 3

| Table Column 1 |  | CDS | JT |
|---|---|---|---|
| . | . |  |  |
| . | . |  |  |

TABLE 3-continued

| Table Column 1 |  | CDS | JT |
|---|---|---|---|
| 120 | 1000111000011100 | −2 | 1 |
| 121 | 1000110011001100 | −2 | 1 |
| 122 | 1000110001111000 | −2 | 1 |
| 123 | 1000011110011000 | −2 | 1 |
| 124 | 1000011110001100 | −2 | 1 |
| 125 | 1000011100110000 | −2 | 1 |
| 126 | 1000011100011100 | −2 | 1 |
| 127 | 1000110001111000 | −2 | 1 |
| 128 | 1110011001100011 | 2 | 1 |
| 129 | 1110011000110011 | 2 | 1 |
| 130 | 1110001110000111 | 2 | 1 |
| 131 | 1110001100110011 | 2 | 1 |
| 132 | 1110000111100011 | 2 | 1 |
| 133 | 1110000110000111 | 2 | 1 |
| 134 | 1100111001100011 | 2 | 1 |
| 135 | 1100111000110011 | 2 | 1 |
| 136 | 1100110011100011 | 2 | 1 |
| 137 | 1100110011000111 | 2 | 1 |
| 138 | 1100110001110011 | 2 | 1 |
| 139 | 1100110001100111 | 2 | 1 |
| 140 | 1100011110000111 | 2 | 1 |
| 141 | 1100011100110011 | 2 | 1 |
| 142 | 1100011001110011 | 2 | 1 |
| 143 | 1100011001100111 | 2 | 1 |
| 144 | 1110011001100001 | 0 | 0 |
| 145 | 1110011000110001 | 0 | 0 |
| 146 | 1110011000011001 | 0 | 0 |
| 147 | 1110001110000011 | 0 | 0 |
| 148 | 1110001100110001 | 0 | 0 |
| 149 | 1110001100011001 | 0 | 0 |
| 150 | 1110001100000111 | 0 | 0 |
| . | . |  |  |
| . | . |  |  |

TABLE 4

| Table Column 4 |  | CDS | JT |
|---|---|---|---|
| . | . |  |  |
| . | . |  |  |
| 30 | 0011000011100111 | 0 | 1 |

TABLE 4-continued

| | Table Column 4 | CDS | JT |
|---|---|---|---|
| 31 | 0011000011110011 | 0 | 1 |
| 32 | 0011000110001111 | 0 | 1 |
| 33 | 0011001100001111 | 0 | 1 |
| 34 | 0000011100110011 | −2 | 0 |
| 35 | 0000011100111001 | −2 | 0 |
| 36 | 0000011110000111 | −2 | 0 |
| 37 | 0000011110011001 | −2 | 0 |
| 38 | 0000110001110011 | −2 | 0 |
| 39 | 0000110001111001 | −2 | 0 |
| 40 | 0000110011000111 | −2 | 0 |
| . | . | . | . |
| 90 | 1000110001110000 | −4 | 1 |
| 91 | 1000110000111000 | −4 | 1 |
| 92 | 1000110000011100 | −4 | 1 |
| 93 | 1000011100110000 | −4 | 1 |
| 94 | 1000011100011000 | −4 | 1 |
| 95 | 1000011100001100 | −4 | 1 |
| 96 | 1000011001110000 | −4 | 1 |
| 97 | 1000011000111000 | −4 | 1 |
| 98 | 1000011000011100 | −4 | 1 |
| 99 | 1000001110011000 | −4 | 1 |
| 100 | 1000001100011100 | −4 | 1 |
| 101 | 1000111000001110 | −2 | 0 |
| 102 | 1000110011000110 | −2 | 0 |
| 103 | 1000110001100110 | −2 | 0 |
| 104 | 1000110000011110 | −2 | 0 |
| 105 | 1000011110000110 | −2 | 0 |
| . | . | . | . |
| 185 | 0011000110011000 | −4 | 1 |
| 186 | 0011001100001100 | −4 | 1 |
| 187 | 0011001100011000 | −4 | 1 |
| 188 | 0011001100110000 | −4 | 1 |
| 189 | 0011100000111000 | −4 | 1 |
| 190 | 0011100001110000 | −4 | 1 |
| 191 | 0000011100011110 | −2 | 0 |
| . | . | . | . |
| 241 | 1001100110000111 | 0 | 1 |
| 242 | 1001100011100011 | 0 | 1 |
| 243 | 1001100011000111 | 0 | 1 |
| 244 | 1001100001110011 | 0 | 1 |
| 245 | 1001100001100111 | 0 | 1 |
| 246 | 1000111001100011 | 0 | 1 |
| 247 | 1000111000110011 | 0 | 1 |
| 248 | 1000110011100011 | 0 | 1 |

TABLE 5

| | Table Column 5 | CDS | JT |
|---|---|---|---|
| . | . | . | . |
| 30 | 1100111100011000 | 0 | 1 |
| 31 | 1100111100001100 | 0 | 1 |
| 32 | 1100111001110000 | 0 | 1 |
| 33 | 1100110011110000 | 0 | 1 |
| 34 | 1111100011001100 | 2 | 0 |
| 35 | 1111100011000110 | 2 | 0 |
| 36 | 1111100001111000 | 2 | 0 |
| 37 | 1111100001100110 | 2 | 0 |
| 38 | 1111100011001100 | 2 | 0 |
| 39 | 1111001110000110 | 2 | 0 |
| 40 | 1111001100111000 | 2 | 0 |
| . | . | . | . |
| 90 | 0111001110001111 | 4 | 1 |
| 91 | 0111001111000111 | 4 | 1 |
| 92 | 0111001111100011 | 4 | 1 |
| 93 | 0111100011001111 | 4 | 1 |
| 94 | 0111100011100111 | 4 | 1 |
| 95 | 0111100011110011 | 4 | 1 |
| 96 | 0111100110001111 | 4 | 1 |
| 97 | 0111100111000111 | 4 | 1 |
| 98 | 0111100111100011 | 4 | 1 |
| 99 | 0111111000110011 | 4 | 1 |
| 100 | 0111110011100011 | 4 | 1 |
| 101 | 0111000111110001 | 2 | 0 |
| 102 | 0111001100111001 | 2 | 0 |
| 103 | 0111001110011001 | 2 | 0 |
| 104 | 0111001111100001 | 2 | 0 |
| 105 | 0111100001111001 | 2 | 0 |
| . | . | . | . |
| 185 | 1100111001100111 | 4 | 1 |
| 186 | 1100110011110011 | 4 | 1 |
| 187 | 1100110011100111 | 4 | 1 |
| 188 | 1100110011001111 | 4 | 1 |
| 189 | 1100011111000111 | 4 | 1 |
| 190 | 1100011110001111 | 4 | 1 |
| 191 | 1111100011100001 | 2 | 0 |
| . | . | . | . |
| 241 | 0110011001111000 | 0 | 1 |
| 242 | 0110011100011100 | 0 | 1 |
| 243 | 0110011100111000 | 0 | 1 |
| 244 | 0110011110001100 | 0 | 1 |
| 245 | 0110011110011000 | 0 | 1 |
| 246 | 0111000110011100 | 0 | 1 |
| 247 | 0111000111001100 | 0 | 1 |
| 248 | 0111001100011100 | 0 | 1 |

An item JT shown in the above Tables 2 to 5 is explained in connection with a state transition diagram.

The sum of the waveform levels DSV of the current nth 16-bit modulation code block, shown by the equation 3, is indicated at an upper column table of Table 1.

CDSP in Table 1 indicates the sum of waveform levels from the leading bit to an arbitrary bit of a 16-bit modulation code block, and corresponds to the above mentioned CDS(k).

The conditions for the sum of the waveform levels DSV=0 in Table 1, are as follows: Not only the above mentioned 8–16 conversion rules are satisfied, but also the number of consecutive "0"s or "1"s in a beginning portion of each code block is 4 or less, the absolute value of the sum of the digital coded waveform levels of coded bit data in the modulated code block is 3 or less, i.e. $|CDS(k)| \leq 3$, with the code digital sum CDS being zero. Alternatively, with the sum of coded digital levels of 16-bit coded data or CDS being −2, the beginning bit of the coded block is "0" and the end of the coded block is two contiguous "0"s or " ... 00", or the beginning bit of the coded block is "0" and the end of the coded block is two contiguous "1"s or " ... 11".

It is apparent that, with the modulated code data having the above mentioned three patterns, the above conditions may be fully met when the data of the 16 bits are complemented.

For example, NRZ modulated code data 144 to 150 shown in table column 0 of Table 2, satisfy the conditions that the number of contiguous "0"s or "1"s at the beginning of the block is 4 or less and the relation $|CDS(k)| \leq 3$ is met, with the code digital sum CDS being zero.

Referring then to table column 1 of Table 3, the data satisfying the above conditions may be prepared by complementing the 16 bit data of the modulated code block shown in table column 0. The data satisfying these conditions are the modulated NRZ code data 144 to 150 shown in table column 1 of Table 3. The code digital sum CDS of the 16 bit data, calculated by equation 1, is found to be equal to zero.

In addition to the above mentioned codes, there is also a modulated code for the digital sum value DSV=0 in which the code digital sum CDS of the 16-bit coded data is −2, the beginning part of the block is "0 . . . " and the end of the block is " . . . 00". The modulated input NRZ code data 128 to 143 shown in table column 0 of Table 2 represent the modulated code data satisfying the above conditions.

There is also a modulation code in which the code digital sum CDS is +2, the beginning part of the code block is "0 . . . " and the end part is two contiguous "1"s or " . . . 11". The modulated NRZ code data 120 to 127 shown in table column 0 of Table 2 correspond to the modulation code satisfying the above conditions.

The modulated code data prepared by complementing the 16-bit data of the modulated input NRZ data shown in table column 0 of Table 2 are shown in table column 1 shown in Table 3.

The 16-bit modulated code data shown in Table 1 are converted from NRZ input data 0 to 255 in such a manner that, with DSV=0, the number of contiguous "0"s or "1"s in any portion of interlinked code blocks is 2 to 5, there are no d.c. components and the absolute value of the DSV is 3 or less, whereby the above mentioned 8 to 16 conversion rule is satisfied and coupling among the code words is taken into account.

Another table for modulated code blocks is prepared on the basis of DSV=±2 wherein the above mentioned 8 to 16 conversion rule is met and the coupling between adjacent code blocks is also taken into account.

As far as this other table for modulation codes is concerned, there is a case wherein the sum of waveform levels DSV=+2 and another case wherein DSV=−2. It is seen from Table 1 that the relation between these two cases is such that the bits of the modulated code blocks are complemented so that the signs of the DSVs are opposite to each other. In addition, the absolute value of the sum of the digital levels of the coded data from the leading bit to an arbitrary k'th bit or CDS(k) is 5 or less in both of these cases. It may be seen from this that the modulation code system satisfies the above condition when DSV=+2 and −2 wherein the signs are opposite to each other.

For this reason, the condition for DSV=+2 is explained, while the opposite case of DSV=−2 is omitted.

In the first place, for DSV=+2, the sum of the absolute values of the digital levels of the above mentioned coded data from the leading bit to an arbitrary bit in the modulated code need to be 5 or less, that is, the absolute value of the sum of digital levels to an arbitrary bit in the code block should be such that −5≦CDS(k)≦1, in order that the 8 to 16 conversion rule and also the conditions shown in Table 1 are met. It is now necessary to prepare a modulation code in which, with modulation codes having a CDS(k) satisfying −5≦CDS(k)≦1, coupling at the neighboring code blocks is also taken into account.

Among the modulation codes for which DSV=+2 and |CDS(k)|≦5, the following six cases are to be considered for 16-bit modulation codes which will satisfy the condition −5≦CDS(k)≦1.

For DSV=+2, the first case is that the code digital sum CDS of the 16-bit data word is zero, the word starts with "00 . . . " and ends with consecutive "1"s, namely " . . . 11".

The second case is that the code digital sum CDS is zero, the data word starts with "1" and "0", that is with "10 . . . " and ends with consecutive "1"s, namely with " . . . 11".

The third case is that the code digital sum CDS is −2 and the word starts with consecutive "0"s, namely with "00 . . . ".

The fourth case is that the code digital sum CDS is −2 and the word starts with "10 . . . ".

The fifth case is that the code digital sum CDS is −4, and the word starts with "00 . . . " and ends with consecutive "0"s, namely with " . . . 00".

The sixth case is that the code digitial sum CDS is −4, as above, and the word starts with "10 . . . " and ends with consecutive "0"s, namely with " . . . 00".

The above mentioned first to sixth cases are shown in table column 4 of Table 4. For example, the modulated code satisfying the first case corresponds to that for modulated input NRZ code data 30 to 33. The modulated code satisfying the second case corresponds to that for modulated input NRZ code data 241 to 248. The modulated code satisfying the third case corresponds to that for modulated input NRZ code data 34 to 40 and 191. The modulated code satisfying the fourth case corresponds to that for modulated input NRZ code data 101 to 105. The modulated code satisfying the fifth case corresponds to that for modulated input NRZ code data 185 to 190. The modulated code satisfying the sixth case corresponds to that for modulated input NRZ code data 90 to 100.

It is similarly seen that, with the sum of levels or digital sum value DSV=−2, the absolute value of the sum of digital levels from the leading bit to an arbitrary k'th bit of the 16-bit data or CDS(k) is given by −1≦CDS(k)≦5. Table 5 shows a modulated code block within the above range of the CDS(k) in which additionally the coupling with the adjoining code blocks is taken into account.

The modulation codes for the input NRZ data 0 to 255 for DSV=±2, are shown in Table 1.

The modulation codes for DSV=±2 satisfy the above first to sixth conditions.

The bit data shown in table column 4 in Table 4 are complemented from the corresponding 16-bit bit data of the modulation code corresponding to the modulated NRZ code data, shown in table column 5 of Table 5, similarly to the data of the table column 0 of Table 2 which are complemented from the data shown in table column 1 of Table 3.

With the present 8 to 16 conversion, since a plurality of conversion codes correspond to each input data word, and it becomes necessary to select quickly the dc-free conversion code corresponding to the input data, tables for the modulation codes which will satisfy the above conditions are prepared in advance. These tables are written in, for example, a read-only memory (ROM) from which corresponding data are read out for digitally modulating the input NRZ data. Six such tables which will satisfy the above mentioned 8 to 16 conversion rule and the rule concerning the coupling between adjacent code blocks are employed in the present embodiment. The formulation of these tables will now be explained.

For DSV=0, modulation codes for association with NRZ data to be modulated are first prepared, using tables columns 0 and 2.

With table column 0, table column data are divided into two, depending on whether the beginning part of the modulation code starts with "00 . . . " or with "01 . . .".

For DSV=0 as above, with table column 2, table column data is divided into two depending on whether the beginning part of the modulation code is started with "00 . . . " or with "11 . . . ".

With tables columns 1 and 3, all 16 bits are complemented from the bits of the table columns 0 and 2, respectively.

With table column 1, table column data is divided into two depending on whether the beginning part of conversion is started with "11 . . . " or with "10 . . . ".

With table column 3, table column data is divided into two depending on whether the beginning part of conversion is started with "11 . . . " or with "01 . . . ".

In this manner, with DSV=0, four table columns are formulated depending on the above mentioned different sets of data.

These table columns may be associated with the original NRZ data in any desired manner.

As for the table columns for DSV=±2, table column data are similarly divided into two depending on whether the starting portion of the modulation code is "00 . . . " or "10 . . . ", while the 16 bits are complemented to produce table column data composed of modulated codes beginning with "11 . . . " and "01 . . . ". Two table columns, namely table columns 4 and 5, are prepared from the combination of the formulated data. These tables for DSV=±2 similarly may be associated with the original NRZ data in any desired manner.

In this manner, six table columns may be prepared for use in digital modulation.

The conditions for selection among these six table columns are hereinafter explained.

In selecting the table columns, the conditions for coupling the modulation codes are of critical importance in order to satisfy the requirements that the number of the consecutive numbers "0" or "1" in any portion of consecutively transmitted or recorded data be 2 or more and 5 or less, the d.c. components be eliminated, and the absolute value of the digital sum value DSV be 3 or less.

In selecting the table columns so as to satisfy the above conditions, tables columns 0 to 5 are selected on the basis of the value of the last two bits of a block preceding the current block and also based on whether the value of the DSV up to the current block is equal to 0 or ±2.

Table column 0 is selected when DSV=0 and the end part of the preceding block is "1" and "0", that is " . . . 10".

Table column 1 is selected when DSV=0 and the end part of the preceding block is "0" and "1", that is " . . . 01".

Table column 2 is selected when DSV=0 and the end part of the preceding block is "1" and "1", that is " . . . 11".

Table column 3 is selected when DSV=0 and the end part of the preceding block is "0" and "0", that is " . . . 00".

Table column 4 is selected when DSV=±2 and the end part of the preceding block is "1" and "1", that is " . . . 11".

Table 5 is selected when DSV=±2 and the end part of the preceding block is "0" and "0", that is " . . . 00".

Although a digital modulation system with six tables has been shown in the foregoing, only two tables may suffice for conversion by using tables that indicate that the code word bits are to be complimented in appropriate cases.

The novel 8 to 16 conversion system is operated in accordance with the state transition diagram shown in FIG. 1.

The symbols used in FIG. 1 will first be explained.

The code digital level sum CDS, the sum of waveform levels CDS(k) from the leading bit to an arbitrary bit k within a modulation code and the sum of waveform levels DSV, are given by the equations 1, 2 and 3 above.

Referring to FIG. 1, the item or status symbol JT, indicating if there occurs status transition in the 8 to 16 conversion, may assume one of two state values, so that the symbol JT which indicates state transition may be represented by one binary bit. Also, in actual circuit operation, the symbol JT indicating, the which indicates state transition, selects one of the states $S_0$ and $S_1$ as will be explained subsequently. More specifically, the symbol JT is used for selecting one of the tables for DSV=0 or =±2, in each of which the data to be used for modulation by 8 to 16 conversion are stored.

Referring to FIG. 1, the digital sum value DSV=0 indicates state $S_0$, while the digital sum value DSV=+2 indicates state $S_1$. For example, consider a state in which the digital sum value DSV(n−1) in the 16-bit (n−1)th modulation code block (represented by) the first term of the right side of the equation 3) is equal to 0. This is state $S_0$, and the digital sum value DSV(n) for the nth block will become 0 if the code digital level sum CDS(n) in the nth 16-bit modulation code block is 0. The symbol JT, which indicates if a state transition occurs is 0 (JT=0), so that, under these conditions, a state transition does not occur, and control reverts to state $S_0$ (loop 1).

Similarly, in state $S_0$, which means that the digital sum value DSV(n−1) for the (n−1)th modulated code block is 0, if the code digital level sum CDS(n) for the nth 16-bit modulated code is ±2, that is, DSV(n)=±2, the symbol indicating whether or not a state transition occurs is 1 (JT=1). Under these conditions, a transition occurs from state $S_0$ to state $S_1$. At this time, the digital sum value DSV(n) for the nth 16-bit modulation code block is ±2, that is, DSV(n)=±2.

The next succeeding 8 to 16 conversion is effected at state $S_1$ which has been changed from state $S_0$. The operation under state $S_1$ is now explained. The digital sum value DSV(n) for the nth 16-bit modulation code at the first term on the right side of the equation 3 is ±2, that is, DSV(n)=±2. If, in this state $S_1$, the code digital level sum CDS(n+1) in the (n+1)th modulation code block is 0, the digital sum value becomes equal to ±2, that is, DSV(n+1)=±2. The symbol JT, which indicates whether or not a state transition occurs is 1 (JT=1) so that no state transition occurs and control reverts to state $S_1$ (loop 2).

On the other hand, if the digital sum value DSV(n) for the nth 16-bit modulation code block is equal to ±2 and, in this state $S_1$, the code digital level sum CDS(n+1) for the (n+1)th modulation code block is equal to −4, or if the digital sum value DSV(n) is equal to −2 and the code digital sum value CDS(n+1) within the next (n+1)th 16-bit modulated code block is equal to +4, the digital sum value DSV(n+1) is equal to −2 or to +2. In these cases, the symbol JT is 1 (loop 3).

If, with the digital sum value DSV(n+1) for the (n+1)th modulation code block is equal to ±2, the code digital level sum CDS(n+2) for the next (n+2)th 16-bit modulation code block is equal to −2 or +2, the digital sum value DSV(n+2) within the (n+2)th modulation code block becomes 0. Therefore, the symbol indicating status transition becomes 0 (JT=0), so that transition occurs from state $S_1$ to state $S_0$.

The state transition diagram of FIG. 1 shows that if, with the digital sum value DSV=0, the code digital level sum within the next 16-bit modulation code block is equal to ±2, or if, with the digital sum value DSV=±2, the code digital level sum CDS within the next 16-bit modulation code block is equal to −2 or +2, state transition occurs.

Although there are two table columns in association with the above mentioned states $S_0$ and $S_1$, there are 56 common modulation codes, so that there are 456 different codes in the 8-to-16 digital modulation system. Since three codes are used for synchronization, the number of codes for the present digital modulation system is ultimately 459.

Since state transition is quite simple for the digital modulation system with 8 to 16 conversion, there is no need to calculate the digital sum value during digital modulation, the hardware may therefore be reduced by approximately 30% as compared to the case of the 8 to 14 modulation system (EFM).

With the present digital modulation system by 8 to 16 conversion, it is necessary to reallocate the serial data into 16-bit parallel data at the time of decoding. Thus the present digital conversion system includes a self-locking pattern for indicating a code boundary for reallocation into 16-bit parallel data.

This self-locking pattern is found by checking ten pattern bits of two consecutive blocks, namely four pattern bits (the last four bits) of a preceding block and six pattern bits (the first six bits) of a succeeding block. That is, in order to provide a self-locking pattern having a period between transitions of 2.5 T, either the four pattern bits of the first block are all "1", and the first one of the six pattern bits of the next block assumes the same value "1" and the succeeding five bits assume "0" or, conversely, the four pattern bits of the first block are all "0" and the first one of the six pattern bits of the next block assumes the same value "0" and the succeeding five bits assume "1".

In this code system, since the 2.5 T-2.5 T pattern occurs only at the time of coupling neighboring code blocks, this pattern may be detected and utilized for self-locking.

Since there is a low probability that the self-locking pattern will occur in a code word in the digital modulation system of the invention, the self-locking pattern is included in the sync pattern and preamble pattern. However, since detection of synchronization becomes impossible if self-locking is disengaged, it is necessary to diminish the probability of spurious locking to as low a value as possible.

It may therefore be envisaged to use 2.5 T-3 T and 3 T-3 T patterns as self-locking patterns, in which case the distance between the code blocks and between the code block and synchronization patterns may be extended by using patterns not included in the code system by 8 to 16 conversion, for thereby lowering the probability of spurious locking.

Since block codes are used in the present digital modulation system by 8 to 16 conversion, synchronization signals and errors may be detected easily.

Moreover, with the present digital modulation system by 8 to 16 conversion, there may be occasions wherein, due to the larger distances between the codes, there is only one code among the valid codes that has the closest Hamming distance to a 16-bit word in which an error has been found during decoding. Therefore, since the error is most likely to have occurred in the code having the closest Hamming distance, it may replace the code word containing the error so that there is decoding by so-called Hamming correction.

Figure 2:
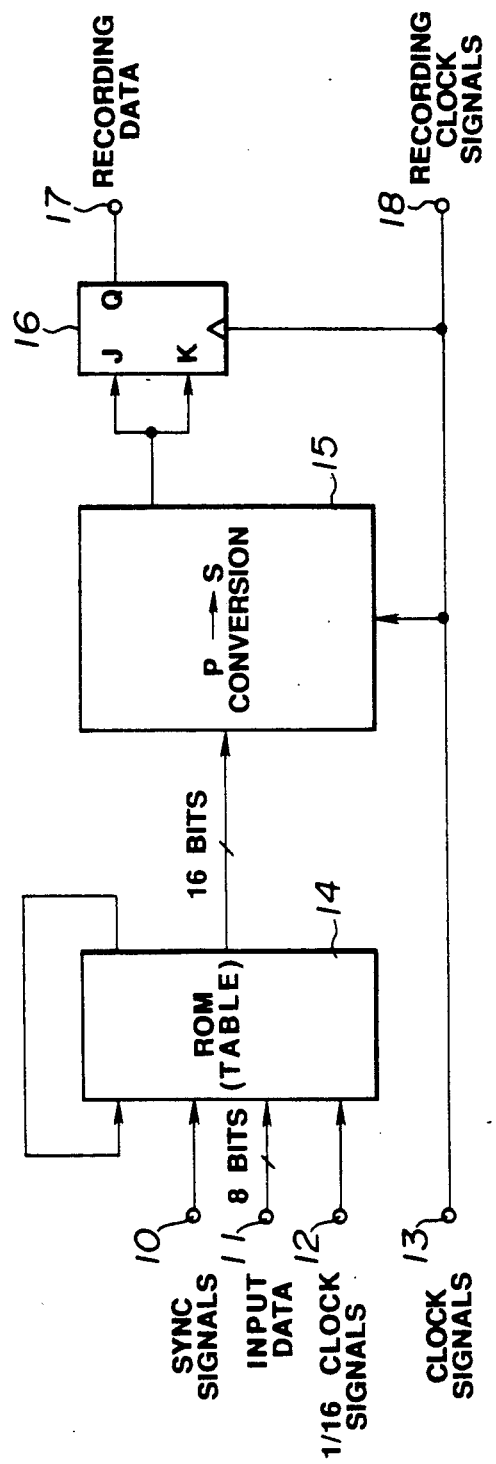
FIG. 2 is a block circuit diagram showing an encoder of the digital modulating system.

Referring to FIG. 2, the circuit construction of an encoder for the novel 8 to 16 conversion system is hereinafter explained.

This encoder includes a read-only memory (ROM) 14. Synchronization signals and input data as code data to be modulated are supplied to ROM 14 by means of input terminals 10 and 11, respectively. The input data are NRZ data divided at intervals of 8 bits.

Clock signals for operating the decoder are supplied from an input terminal 13 to a parallel to serial converter 15 and to a clock terminal of a J-K flipflop 16. Converter 15 is adapted for outputting input parallel bits as serial bits. The clock signals are outputted as recording clock signals at an output terminal 18.

Clock signals having a frequency equal to 1/16 of the clock frequency are supplied via input terminal 12 to ROM 14.

A table select signal for selecting one of the six tables is outputted from and entered to ROM 14. The conditions under which the table is selected include the digital sum value DSV and data assumed by the last two bits of the preceding code block, as discussed hereinabove.

The input 8-bit NRZ data words to be modulated are converted into 16 bit modulation code data words in accordance with the NRZ data in the table number of ROM 14 as selected according to the previous paragraph. The output from ROM 14 is in the form of 16-bit parallel data words.

Parallel to serial converter 15, outputting parallel input words as serial bits, is supplied with output signals from ROM 14 and converts these signals into serial 1-bit output signals by clocks supplied from input terminal 13. These output signals are supplied to a J-terminal and a K-terminal of a J-K flipflop 16. J-K flipflop 16 issues output signals while the state of the signals is maintained or complemented depending on the state of signals supplied to the J and K terminals at the rising edges of clock signals supplied to the clock terminal of the J-K flipflop via input terminal 13.

The output signals are outputted via output terminal 17 as data to be recorded.

Figure 3:
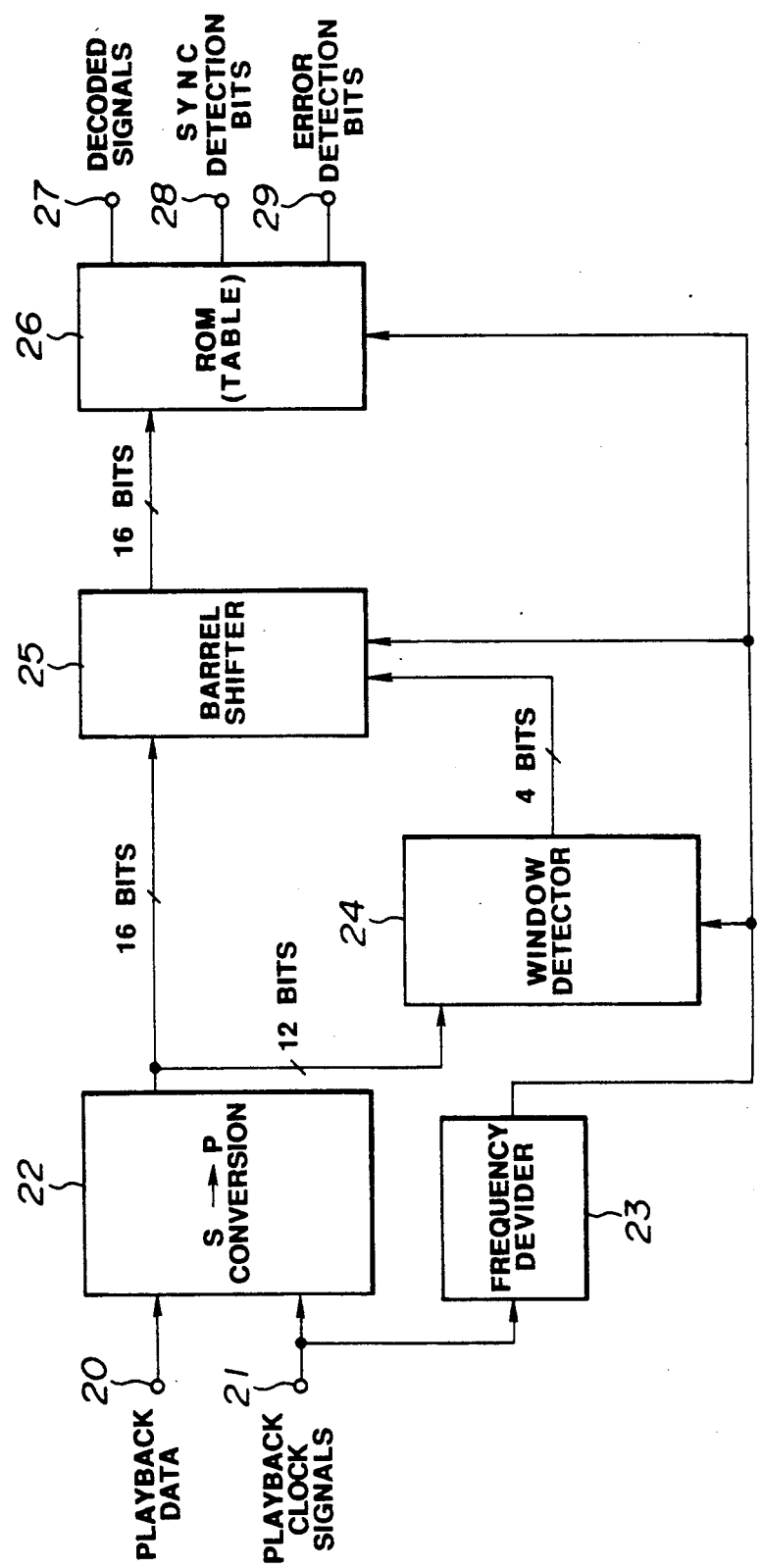
FIG. 3 is a block circuit diagram showing a decoder of the digital modulating system.

Referring to FIG. 3, a decoder operating in accordance with the present 8 to 16 conversion system is explained.

Playback data supplied via input terminal 20 and playback clocks supplied via input terminal 21 are entered to a serial-to-parallel converter 22. The input playback data, supplied as serial data on a bit-by-bit basis, are converted into parallel data of a plurality of, e.g. 16 bits, at the timing of the input playback clocks. The output of serial-to parallel converter 22 is transmitted to a so-called barrel shifter 25 and a window detector 24. The input signal to the window detector 24 12-bit signal from the 16-bit signal outputted from the serial to parallel converter 22.

The playback clocks supplied via input terminal 21 are supplied to a frequency divider 23. Frequency divider 23 divides the playback clocks in frequency by 1/16 and supplies the frequency divided clock signals to window detector 24, barrel shifter 25 and to ROM 26.

Window detector 24 is for detecting a pattern that indicates a boundary between the code blocks produced upon 8 to 16 conversion. To accomplish detection, window detector 24 converts the phase difference between the pattern indicating the boundary and the 1/16 clock frequency supplied by frequency divider 23, in terms of a deviation from the edge, into 4-bit digital signals, which then are supplied to barrel shifter 25.

Barrel shifter 25 phase-shifts the 16-bit output signals from serial-to-parallel converter 22 in accordance with the 4-bit digital code data supplied from window detector 24. The phase-adjusted 16-bit signals are supplied to ROM 26.

ROM 26 is driven by playback clock signals provided by frequency divider 23 and outputs via output terminal 27 8-bit output data corresponding to the 16-bit signals supplied by barrel shifter 25.

ROM 26 also outputs synchronization detection bits and error detection bits at output terminals 28 and 29, respectively.

With the above arrangement, decoding may be effected in accordance with the present 8 to 16 conversion system.

Figure 4:
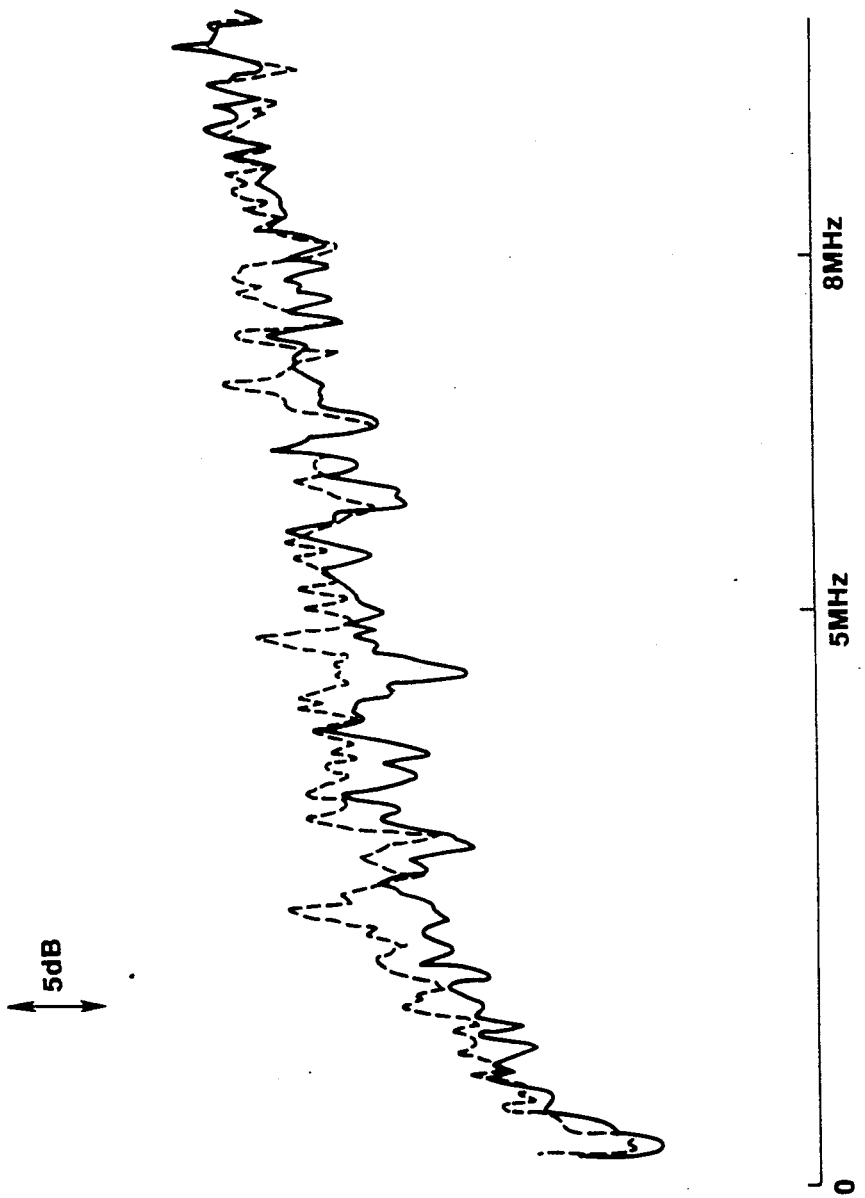
FIG. 4 is a graph showing frequency characteristics for an $M^2$ code conversion system and the novel 8 to 16 conversion system for digital modulation.

FIG. 4 shows the results of analysis by a spectrum analyzer of frequency characteristics of the present 8 to 16 conversion system and the $M^2$ code conversion system.

As shown in FIG. 4, the level of the spectrum shown by the frequency characteristics of the present 8 to 16 conversion system is smaller than the level of the spectrum shown by the frequency characteristics of the $M^2$ conversion system, or frequencies of about 5 MHz and lower. Thus it is shown that low frequency components may be suppressed by diminishing the maximum length between transitions $T_{MAX}$.

Table 6 shows parameters characteristic of various conversion systems.

TABLE 6

|  | Novel 8 to 16 Conversion | $M^2$ Code | 8 to 14 Conversion |
|---|---|---|---|
| Minimum Length Between Transitions $T_{MIN}$ | 1.0T | 1.0T | 1.14T |
| Maximum Length Between Transitions $T_{MAX}$ | 2.5T | 3.0T | 4.0T |
| Window Maring $T_W$ | 0.5T | 0.5T | 0.56T |
| Level Sum Value $|DSV|$ | $\leq 3.0$ | $\leq 3.0$ | $\leq 11.0$ |
| Level Sum Value $|CDS|$ | $\leq 4.0$ | — | $\leq 6.0$ |
| Number of Coded Data | $918/2^{16}$ | — | $667/2^{14}$ |

It is seen from Table 6 that, with the novel 8 to 16 conversion system, the minimum length between transitions $T_{MIN}$, the window margin $T_W$ and the DSV are maintained at the same level as those of the $M^2$ code, while the maximum length between transitions $T_{MAX}$ may be less than that with the $M^2$ code. The result is that the low frequency components may be suppressed more extensively than in the case of modulation by the $M^2$ code.

With the above described novel 8 to 16 conversion system, because of the smaller content of the low frequency components than in the $M^2$-code, it becomes possible to diminish crosstalk between adjacent tracks during recording to improve the S/N ratio of the eye pattern.

Furthermore, even if the shortest wavelength employed for recording is of the same order as that in the $M^2$ code, the maximum length between transitions may be as small as 2.5 T to facilitate clock locking by the PLL system on the reproducing side.

With the novel 8 to 16 conversion system, the rate of erasure during overwriting may be improved by improved spectral concentration.

In addition, with the novel 8 to 16 conversion system, the hardware volume may be diminished by arraying the modulation code carrying tables ingeniously in the ROM.

From the foregoing it is seen that the present invention provides a digital modulation system in which a string of input data is divided at intervals of eight bits and the resulting 8-bit data words are converted into 16-bit digital modulation code data words, wherein the 16-bit digital modulation code data words satisfy the conditions that the number of consecutive digits "0" or "1" is two or more between the 2nd bit and the 15th bit of each word, the consecutive number of "0"s or "1"s between the 1st bit and the 16th bit is five or less, the consecutive number of "0"s or "1"s between the 13th bit and the 16th is four or less, the absolute value of the sum of the 16 bits of the modulation code, used for calculating a digital sum value (DSV) in which "1" and "0" of the bits in the modulation code are set to "+1" and "−1" and summed together, is 4 or less; and that the absolute value of the sum from the leading bit to an arbitrary selected k'th bit in the modulation code, or the CDS(k), is 5 or less, and wherein the number of consecutive "0"s or "1"s in any part of digital data produced upon consecutively transmitting or recording 16-bit digital modulation code data satisfying the above conditions is not less than two and not more than five, the 16-bit digital modulation code data is substantially dc free and the absolute value of the DSV is not more than three. With the present modulation system, an error rate more favorable than that with the $M^2$ code of the conventional digital conversion system may be achieved for realizing short wavelength recording on narrow tracks for high density recording on e.g. a digital tape recorder. The erasure rate during overwriting may be improved because of the higher degree of spectral concentration.

The quantity of hardware may also be diminished by ingenious selection of the array in which modulation codes are listed in tables within the ROM.

What is claimed is:

1. A method of modulating digital data by converting 8-bit data words of a binary system, wherein each indicates one of two binary values of '1' or '0', into binary 16-bit data words of the same binary system, said method comprising:
   sequentially separating 8-bit data words from an input data stream, forming a 16-bit data words consisting of 1st to 16th bits and satisfying the following conditions (1) to (5), for each of said 8-bit data words,
  (1) the number of consecutive '0's or '1's from the second to the 15th bits is two or more;
  (2) the number of consecutive '0's or '1's from the first to the 16th bits is five or less;
  (3) the absolute value of the code word digital sum (CDS), obtained upon summing scores '+1' and '−1' for said binary values of '1' and '0', respectively, for the 1st to 16th bits, is four or less;
  (4) the absolute value of the code word digital sum CDS(k), obtained upon summing scores '+1' and '−1' for said binary values of '1' and '0', respectively, for the 1st to kth bits, where $1 \leq k \leq 16$, is five or less; and
  (5) when the 16-bit data are converted into serial data which are then coupled together and outputted, the number of consecutive '0's and '1's in any part of the outputted serial data is not less than two and not more than five, and the absolute value of the digital sum value (DSV), obtained as the sum of scores '+1' and '−1' for said binary values of '1' and '0', respectively, calculated from the beginning of said serial data to any point therein, is not more than three; and
converting each said 16-bit data word into serial data and coupling the serial 16-bit data for outputting as coupled modulated digital data.

2. The method as in claim 1, wherein said step of forming a 16-bit data word comprises the substeps of:
  selecting one of a plurality of tables on the basis of the value of the last two digits of the preceding 16-bit data word and the value of the DSV of said preceding 16-bit data word, each of said tables associating 8-bit data words with 16-bit modulation codes; and
  reading out from said selected table the 16-bit modulation code associated with said each 8-bit data word.

3. The method as in claim 2, wherein said tables are stored in a ROM.

4. A digital modulation apparatus for converting 8-bit data of a binary system, wherein each indicates one of two binary values of '1' or '0', into binary 16-bit data of the same binary system, comprising:

means for sequentially separating 8-bit data words from an input data stream,
means for forming a 16-bit data word consisting of 1st to 16th bits, and satisfying the following conditions (1) to (5), for each of said 8-bit data words,
  (1) the number of consecutive '0's or '1's from the second to the 15th bits is two or more;
  (2) the number of consecutive '0's or '1's from the first to the 16th bits is five or less;
  (3) the absolute value of the code word digital sum (CDS), obtained upon summing scores '+1' and '−1' for said binary values of '1' and '0', respectively, for the 1st to 16th bits, is four or less;
  (4) the absolute value of the code word digital sum CDS(k), obtained upon summing scores '+1' and '−1' for said binary values of '1' and '0', respectively, for the 1st to kth bits, where $1 \leq k \leq 16$, is five or less; and
  (5) when the 16-bit data are converted into serial data which are then coupled together and outputted, the number of consecutive '0's and '1's in any part of the outputted serial data is not less than two and not more than five, and the absolute value of the digital sum value (DSV), obtained as the sum of scores '+1' and '−1' for said binary values of '1' and '0', respectively, calculated from the beginning of said serial data to any point therein, is not more than three; and
means for converting each said 16-bit data word into serial data and coupling the serial data for outputting as coupled modulated digital data.

5. The apparatus as in claim 4, wherein said means for forming a 16-bit data word comprises:
  means for storing a plurality of tables which associate 8-bit data words with 16-bit modulation codes;
  means for selecting one of said tables on the basis of the value of the last two digits of the preceding 16-bit data word and the value of the DSV of said preceding 16-bit data word; and
  means for reading out from said selected table the 16-bit modulation code associated with said each 8-bit data word.

6. The apparatus as in claim 5, wherein said storing means comprises a ROM.

* * * * *